United States Patent [19]

Bowers, III et al.

[11] Patent Number: 5,680,025
[45] Date of Patent: Oct. 21, 1997

[54] PROACTIVE MOTOR MONITORING FOR AVOIDING PREMATURE FAILURES AND FOR FAULT RECOGNITION

[75] Inventors: Stewart V. Bowers, III; Kenneth R. Piety, both of Knoxville; William A. Davis, Oak Ridge, all of Tenn.

[73] Assignee: CSI Technology, Inc., Wilmington, Del.

[21] Appl. No.: 320,152

[22] Filed: Oct. 7, 1994

[51] Int. Cl.$^6$ ........................................... H02P 5/28
[52] U.S. Cl. .................. 318/806; 318/471; 318/641; 318/490; 318/430; 361/25
[58] Field of Search .................. 318/430–434, 318/471–474, 490, 798–815, 54, 641, 599; 361/23, 24, 25, 98, 139, 158; 324/545, 158; 364/485, 582

[56] References Cited

U.S. PATENT DOCUMENTS

| | | | |
|---|---|---|---|
| 4,495,448 | 1/1985 | Dumbeck | 318/54 |
| 4,547,826 | 10/1985 | Premerlani | 361/25 |
| 4,612,620 | 9/1986 | Davis et al. | 364/551 |
| 4,761,703 | 8/1988 | Kliman et al. | 361/23 |
| 5,049,815 | 9/1991 | Kliman | 324/158 |
| 5,103,926 | 4/1992 | Ohno et al. | 318/599 |
| 5,252,915 | 10/1993 | Sedding et al. | 324/158 |
| 5,420,523 | 5/1995 | Walker et al. | 324/158 |
| 5,446,362 | 8/1995 | Vanek et al. | 318/801 |

OTHER PUBLICATIONS

M.N. Dey, "On–line Protection of Electrical Machines by Microcomputer Analysis of Axial Leakage Flux," Ph.D. Thesis, University of Aberdeen, U.K., 1983 YN.

J. Penman, M.N. Dey, A.J. Tait and W.E. Bryan, "Condition Monitoring of Electrical Drives," IEE Proceedings, vol. 133, Pt. B, No. 3, May 1986.

J. Penman and M.N. Dey, "Multi–Functional Monitoring and Protection Scheme for Electrical Machines," UPEC 19 Universities of Dundee and Aberdeen, U.K.

R.A. Leonard and W.T. Thomson, "Vibration and Stray Flux Monitoring for Unbalanced Supply and Inter–Turn Winding Fault Diagnosis in Induction Motors"; British Journal of NDT, pp. 211–215, Jul. 1986.

W.T. Thomson, R.A. Leonard, A.J. Milne, and J. Penman, "Failure Identification of Offshore Induction Motor Systems Using On–Condition Monitoring," Proceedings of 4th National Reliability Conference, Birmingham, U.K., 1983.

Walker, P., "Preventing Motor Shaft–Current Bearing Failures", Plant Engineering, Oct. 4, 1990.

Costello, M.J., "Shaft Voltages & Rotating Machinery," IEEE Paper No. PCIC–91–13, 1991.

Berry, L.D., "How to Link Thermal and Vibration Data to Diagnose Mechanical Power Transmission Problems", P/PM Technology, Apr., 1993, pp. 12–14.

Brancato, E.L., "Estimation of Lifetime Expectancies of Motors", IEEE Electrical Insulation Magazine, vol. 8, No. 3, May/Jun. 1992.

Nailen, R.L., Motors, EPRI Power Plant Electrical Reference Series, vol. 6, 1987.

NEMA Standards Publication No. MG1, National Manufactures Association, NEMA MG Jan. 1987.

Obenhaus, R.E., "Motor thermal protection minimizes downtime", in Electric Motor Manual, McGraw–Hill, Inc. 1987, pp. 99–102.

*Primary Examiner*—Karen Masih
*Attorney, Agent, or Firm*—Luedeka, Neely & Graham, P.C.

[57] ABSTRACT

Apparatus which automates the collection of motor temperature, flux and shaft current data for proactive motor maintenance. Motor speed is determined by an analysis of the flux frequency spectrum, and motor load is determined based on speed, from which a normalized thermal parameter is then determined. From a spectrum analysis of magnetic flux signals a set of peaks each characterized by a frequency and an amplitude is found, and a subset of peaks is identified in accordance with predetermined identity criteria for purposes of comparison. Temperature, magnetic flux and shaft current data are trended to provide early indications of degradation, as well as for recognizing faults.

37 Claims, 8 Drawing Sheets

PROACTIVE MOTOR MONITORING FOR AVOIDING PREMATURE FAILURES AND FOR FAULT RECOGNITION

BACKGROUND OF THE INVENTION

The present invention relates generally to the maintenance of AC induction motors and related components such as shaft couplings driving rotating machinery and, more particularly, to techniques for predicting premature failure and for recognizing motor and motor-related faults.

Vibration monitoring and analysis is a primary method for predicting premature failure in electric motors. However, there are other proactive monitoring and analysis techniques which can be employed to avoid premature failures, as well as to provide additional sensitivity to faults which alter the electrical characteristics of a motor, such as broken rotor bars, eccentricity, imbalance between phases and stator electrical faults. Three proactive measurements which are advantageously employed in the context of the present invention are temperature, magnetic flux, and shaft current.

Considering temperature first, it is known that abnormal temperatures are indicative of various potential motor problems such as hot spots in the stator, overheating due to poor airflow, overheating due to unbalanced voltage, and potential bearing failure. Moreover, excessive and prolonged heat is the main factor responsible for shortening the life expectancy of motors. The two motor components most affected by excessive heat are the insulation system and bearings. A general rule of thumb is that the thermal life of an insulation system is halved for each 10° C. increase in exposure temperature. Higher temperatures also reduce the viscosity of oil or grease in bearings. Thus, bearings fail prematurely due to improper lubrication. Therefore, detecting excessive heat within motors and preventing extended periods of operation under such conditions is highly desirable.

Common causes of overheating are overloading, bearing seizure and misalignment. However, many other effects can contribute to overheating. Examples include restricted ventilation, single phasing of a three-phase motor, high ambient temperatures, excessive duty cycle, and power supply variations (high, low or unbalanced voltage). It is significant that many of these are conditions which can be remedied before an actual failure occurs.

Motor temperature by itself however is not a reliable indicator of motor condition. Thus, motor load and ambient temperature must also be taken into account. A given temperature rise above ambient while a motor is operating under 100% load might be perfectly acceptable, while the same temperature rise when the motor is operating under a lighter load could be indicative of a problem. A temperature-load current formula is, for example, given in a paper by Alan C. Pierce, Factory Mutual Research Corp., Infraspection Institute, IR/INFO '90, New Orleans, La. May 17, 1990.

Next considering magnetic flux, an electric motor by definition produces magnetic flux. Any small imbalance in the magnetic or electric circuit of a motor effectively magnifies axially transmitted fluxes. As is disclosed for example in Kliman et al U.S. Pat. No. 4,761,703, a flux coil may be employed as a sensor for detecting flux signals. A frequency spectrum analysis, such as by employing a Fast Fourier Transform (FFT) reveals the existence of a great many frequency components, with relatively complex relationships. Kliman et al suggest that an analysis of the frequency spectrum can be done to determine slip frequency (the difference between synchronous speed and actual rotational speed). In addition, Kliman et al suggest that analysis of so-called rotor fault harmonics can indicate various motor faults such as broken rotor bars. Kliman U.S. Pat. No. 5,049,815 discloses related techniques based solely on an analysis of motor current spectra.

Investigators at the University of Aberdeen in Scotland have extensively analyzed various frequency components which can be found in axial flux signal waveforms produced by AC induction motors, and have proposed that the results of such analysis be employed for motor condition monitoring and fault recognition. Literature references include M. N. Dey, "On-line Protection of Electrical Machines by Microcomputer Analysis of Axial Leakage Flux," Ph.D. Thesis, University of Aberdeen, U.K., 1983; J. Penman, M. N. Dey, A. J. Tait and W. E. Bryan, "Condition Monitoring of Electrical Drives," IEE Proceedings, Vol. 133, Pt. B, No. 3, May 1986; J. Penman and M. N. Dey, "Multi-Functional Monitoring and Protection Scheme for Electrical Machines," UPEC 19 Universities of Dundee and Aberdeen, U.K.; R. A. Leonard and W. T. Thomson, "Vibration and Stray Flux Monitoring for Unbalanced Supply and Inter-Turn Winding Fault Diagnosis in Induction Motors"; British Journal of NDT, pages 211–215, July 1986; and W. T. Thomson, R. A. Leonard, A. J. Milne, and J. Penman, "Failure Identification of Offshore Induction Motor Systems Using On-Condition Monitoring," Proceedings of 4th National Reliability Conference, Birmingham, U.K., 1983.

Motor shaft currents can be produced, through transformer action, by stray magnetic forces caused by slight dissymmetries in the iron circuit of the motor. Magnetically-induced currents circulating between the motor rotor and the stator frame are interfaced at the motor bearings, which currents can cause the bearings to fail. See, for example, Walker, P., "Preventing Motor Shaft-Current Bearing Failures", Plant Engineering, Oct. 4, 1990; and Costello, M. J., "Shaft Voltages & Rotating Machinery," IEEE Paper No. PCIC-91-13, 1991.

SUMMARY OF THE INVENTION

It is an object of the invention to provide apparatus for proactively monitoring the conditions of AC induction motors employing a portable system which monitors as few parameters as possible without sacrificing needed information.

It is another object of the invention to provide effective apparatus for employing temperature, or flux, or shaft current, or combinations of these three to proactively monitor motors, and additionally to recognize conditions which alter the electrical characteristics of the motor, such as broken rotor bars, eccentricity, imbalance between phases and stator electrical faults.

It is another object of the invention to calculate and effectively employ a normalized temperature rise parameter for trending motor condition over a period of time.

It is another object of the invention to provide apparatus for proactive motor monitoring which is easy to use with repeatable results.

Briefly, apparatus in accordance with the invention for monitoring the condition of at least one AC induction motor includes a magnetic flux transducer for sensing magnetic flux generated by the motor during motor operation, preferably a motor temperature measuring device for measuring the temperature of at least one motor temperature measurement point during motor operation as well as an ambient temperature measuring device, and a data processing system arranged to receive data from the motor temperature measuring device, from the ambient temperature measuring device and from the magnetic flux transducer. A shaft current probe for measuring shaft currents may also be included.

Various motor temperature measurement points may be employed, such as the skin of the motor, a motor electrical junction box, a motor bearing, or on a shaft coupling associated with the motor. The temperature measuring device may be a thermocouple but, preferably, is an infrared thermometer.

In the illustrated embodiment, the data processing system is distributed, and comprises a portable data collector and a base unit which are capable of at least periodically being linked for data transfer. The data processing functions are apportioned between the portable data collector and the base unit in an appropriate manner. However, all of the functions can be implemented in one unit, such as in the portable data collector.

Preferably, the data processing system additionally stores routing information relating to particular AC induction motors to be inspected, and includes a display for prompting a user of the apparatus of the invention regarding the particular AC induction motors to be inspected.

In one embodiment, the data processing system is operable to determine motor load based on sensed magnetic flux and to calculate a normalized temperature rise parameter as a function directly related to the difference between motor temperature and ambient temperature and inversely related to motor load. More particularly, the data processing system determines motor load by performing a frequency spectrum analysis of motor magnetic flux to determine motor speed, and then employs motor speed as a basis for calculating motor load. Alternatively, a separate device such as a strobe light or a tachometer can be employed for determining motor speed. The data processing system maintains a record of the calculated normalized temperature rise parameter for trending the calculated normalized temperature rise parameter over a period of time.

In another embodiment of the invention, the data processing system is operable to perform a frequency spectrum analysis of motor magnetic flux to find a set of peaks each characterized by a frequency and an amplitude, and to identify a subset of peaks in accordance with predetermined identity criteria for purposes of comparison. In this embodiment, the data processing system is operable to maintain a record of the frequency spectrum analysis over a period of time for recognizing a change in the condition of the motor. In a more particular embodiment, the data processing system is operable to maintain a record of the subset of peaks organized by identity, and is further operable to compare the amplitudes of the subset of peaks at one point in time with the amplitudes of the subset of peaks at a different point in time, by identity, to identify a change in the motor condition, such as a broken rotor bar. In one embodiment, the identity criteria comprise integer multiples and submultiples of the product of the number of motor poles and the slip frequency as sidebands on either side of the line frequency.

For repeatability, the magnetic flux transducer preferably comprises a formed flux coil including a suitable mounting device such as a clip or permanent magnets for retaining the formed flux coil in position on the motor.

The system may also acquire data from a shaft current probe for frequency spectrum analysis, and trending.

BRIEF DESCRIPTION OF THE DRAWINGS

While the novel features of the invention are set forth with particularity in the appended claims, the invention, both as to organization and content, will be better understood and appreciated, along with other objects and features thereof, from the following detailed description, taken in conjunction with the drawings, in which:

DETAILED DESCRIPTION

Figure 1:
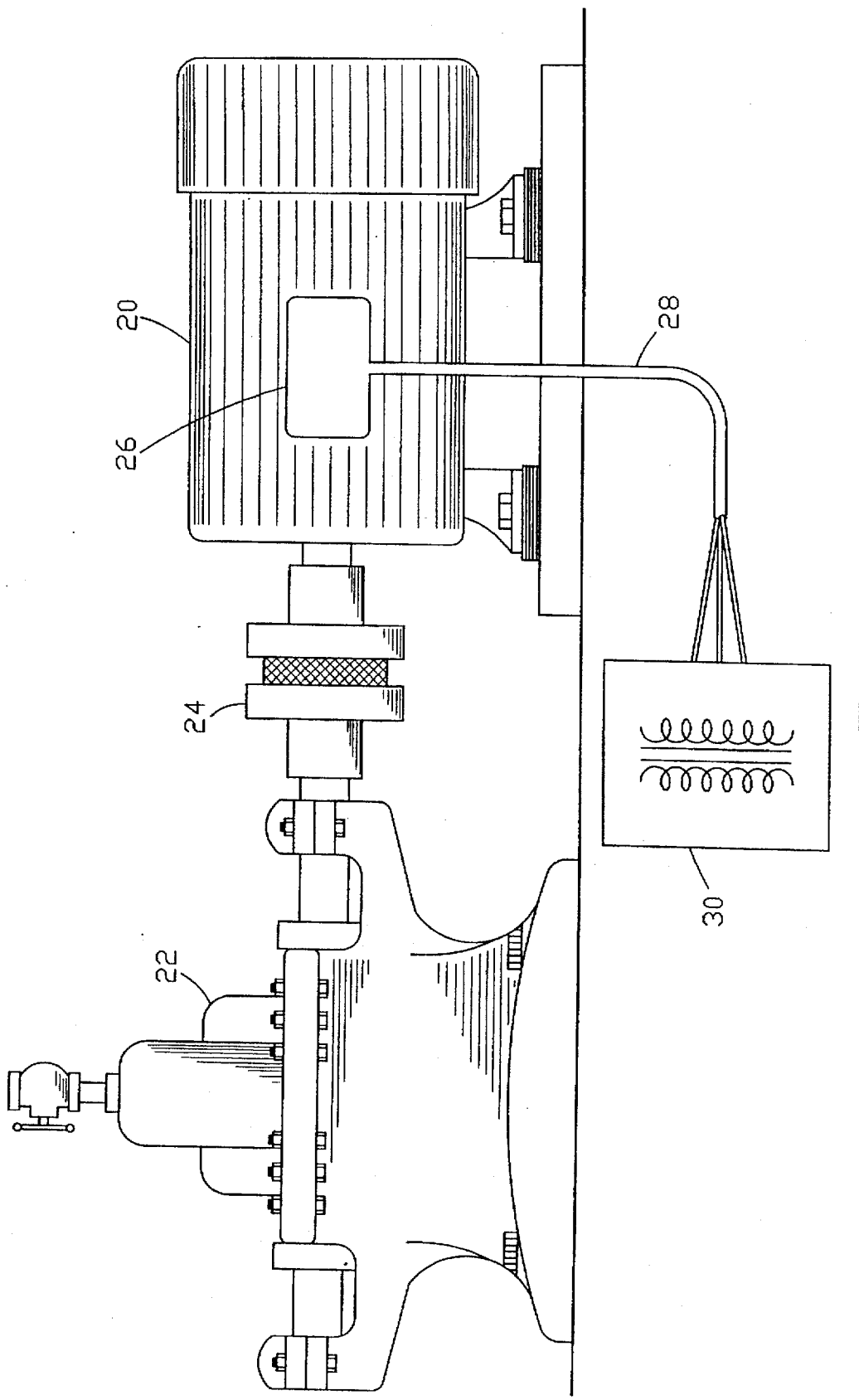
FIG. 1 depicts the environment in which the invention may be employed, in particular, a three-phase AC induction motor driving a pump through a shaft coupling.

Referring initially to FIG. 1, an environment in which the present invention may be employed takes the form of a three-phase AC induction motor 20 driving a pump 22 through a shaft coupling 24. The motor 20 includes a motor termination box 26 which houses an electrical junction at which conductors from power lines within a conduit 28 are connected to supply lines (not shown) of the motor. The motor 20 is powered from an AC power line, depicted in highly schematic fashion as a transformer 30. A typical nominal AC power line frequency is 60 Hz, although 50 Hz is employed in some countries.

The invention also applies to variable speed induction motors, where the motor itself is supplied with power at a "line frequency" which is not necessarily the main AC power line frequency.

As is well known, the motor internally employs a given number of magnetic poles, organized as pole pairs. The motor synchronous speed (maximum unloaded speed) is equal to the AC line frequency divided by the number of pole pairs. Thus, the synchronous speed of a two-pole motor for example is 60 revolutions per second (RPS), or 3600 revolutions per minute (RPM). The synchronous speed of a four-pole motor for example is 30 RPS or 1800 RPM. As yet another example, the synchronous speed of a ten-pole motor is 12 RPS, or 720 RPM.

The actual running speed of a motor under load is less than the synchronous speed, and the difference between synchronous speed and running speed is known as the slip frequency. When synchronous speed and running speed are both expressed in units of revolutions per second (RPS), the slip frequency is then expressed in Hertz (Hz). For example, a four-pole motor may be rated at 1740 rpm at full load, making the rated slip (1800–1740)=60 RPM, which is equivalent to a slip frequency of 1 Hz.

Figure 2A:
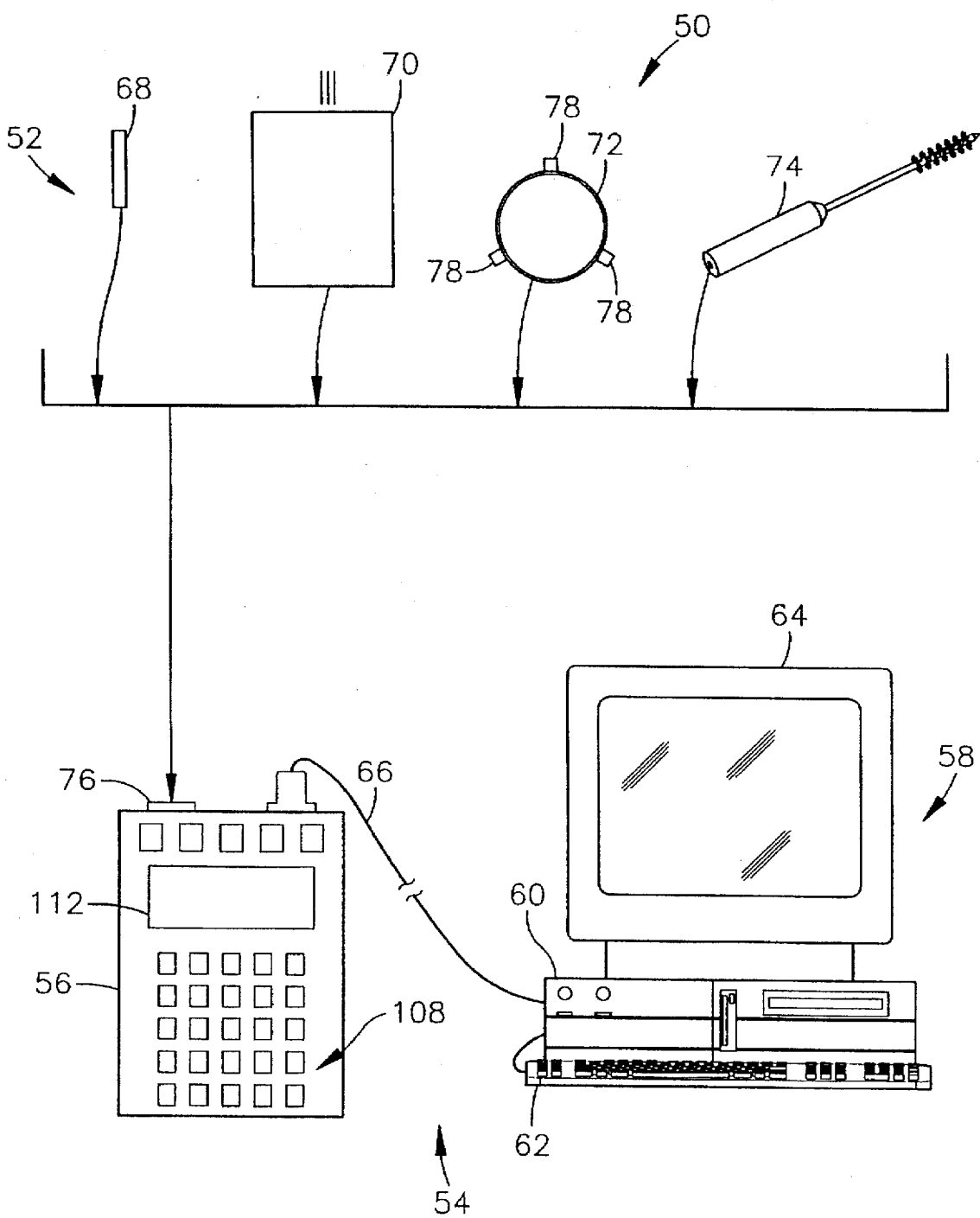
FIG. 2A depicts apparatus of the invention in overview, including a plurality of motor parameter measurement devices selectively connectable to a microprocessor-based portable data collector.

Referring next to FIG. 2A, apparatus 50 in accordance with the invention includes a set 52 of measurement devices or transducers, and a data processing system 54 illustratively comprising a microprocessor-based portable data collector 56, and a base unit 58. The base unit 58 preferably takes the form of a conventional personal computer (PC) including a CPU unit 60, a keyboard 62 and a video display monitor 64. The portable data collector 56 and the base unit 58 are capable of at least periodically being linked for data transfer via a representative RS232 communications link 66. While, generally, the base unit 58 is employed for long-term data storage and more elaborate data analysis, it will be appreciated that the portable data collector 56 may include significant data storage and processing capability, and the distribution of computational and storage functions as between the two elements 56 and 58 of the data processing system 54 is a matter of design choice. For example, with appropriate miniaturization technology, all of the required functions may be embodied in the portable data collector 56.

Similarly, although a wired RS232 communications link is illustrated, it will be appreciated that any suitable link may be employed for data transfer, such as an optical communications link, a radio communications link, or a removable memory card such as a PCMCIA card.

The set 52 of exemplary measurement devices or sensors includes a thermocouple 68, an infrared (IR) thermometer 70 such as a CSI model 505 Infrared Thermometer manufactured by Exergen Corporation, a flux coil 72 and a shaft current probe 74. The various measurement devices or sensors of the set 52 are selectively connectable to the portable data collector 56 through an appropriate connector 76.

The flux coil 72 is a relatively simple sensor made of insulated magnet wire wound into a coil. Normally, wire size ranges from 20 AWG to 30 AWG. The more turns, the larger the signals. Generally, 100 to 200 turns are sufficient. The output from the flux coil sensor 72 is a current signal, the relative amplitude of which depends on the number of turns used to make the coil. A typical flux coil 72 diameter is eight inches, but may be varied based on the size of the motor.

When magnet wire is wrapped to form a coil, the resulting flux coil is fairly flexible, and has the apparent advantage that the coil can be shaped to fit in and around many odd-shaped spaces. However, in order to collect repeatable and reliable flux data, consistency is a major concern. Even though subsequent measurements may be taken at the same place on a motor, if the coil shape is significantly different from one measurement to the next, absolute frequency amplitudes can vary. This limits the reliability of trend data. Accordingly, in accordance with the invention the flux coil 72 comprises a formed flux coil 72.

Further in accordance with the invention, the flux coil 72 includes a mounting device for retaining the formed flux coil 72 in a fixed position on a motor. The mounting device may take the form of suitable clips or, as illustrated, several permanent magnets 78.

The shaft current probe 74 is described in greater detail in concurrently-filed Bowers et al patent application Ser. No. 08/320196 entitled "Apparatus for measuring Electrical Signals on a Rotating Shaft Apparatus", the entire disclosure of which is hereby expressly incorporated by reference.

Figure 2B:
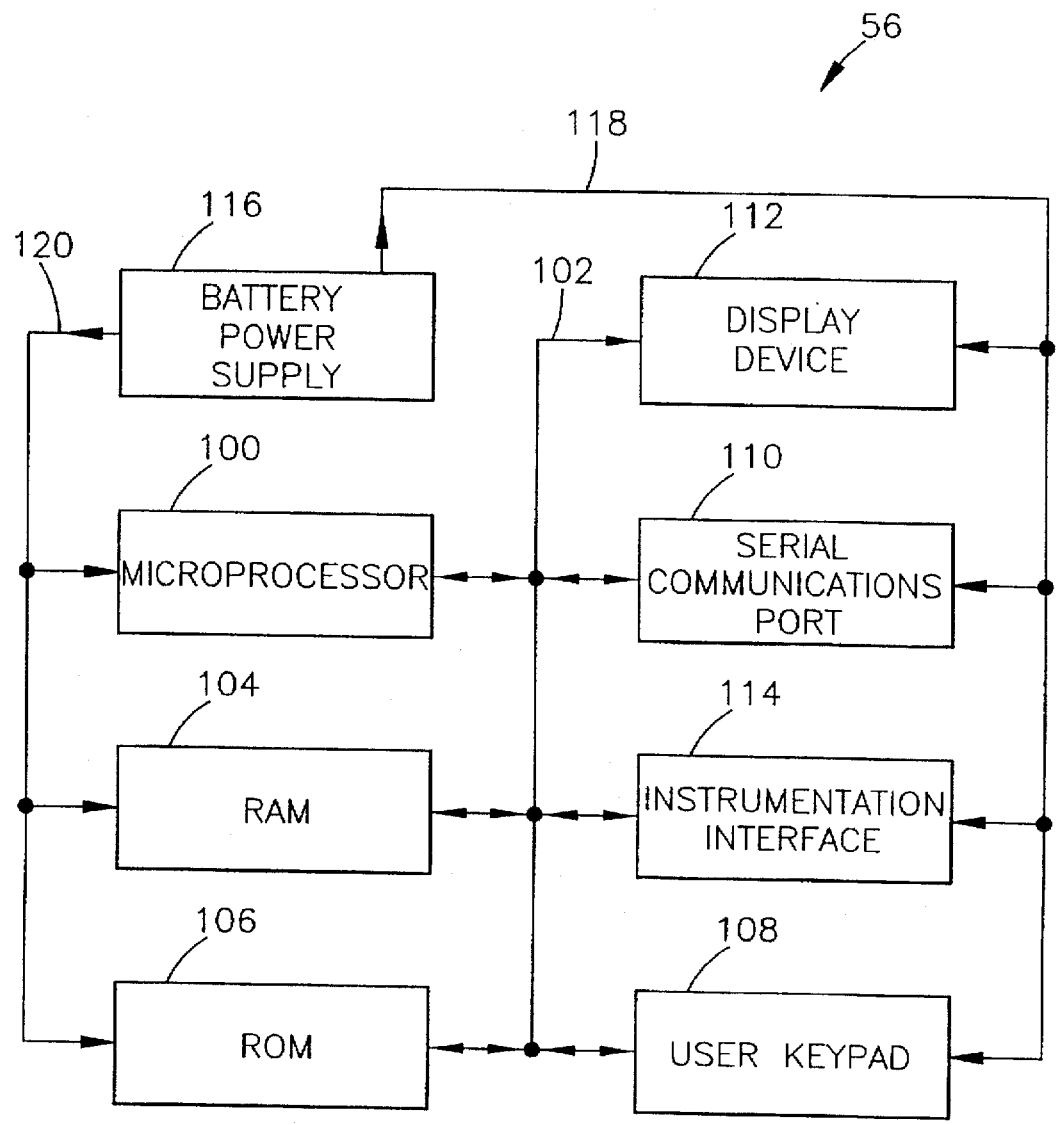
FIG. 2B illustrates in block diagram form internal elements of the FIG. 2A portable data collector.

FIG. 2B is a diagram of the internal arrangement of the portable data collector 56, which may be seen to comprise a conventional microprocessor-based system including a microprocessor 100, such as an Intel 8080 microprocessor or a Zilog Z80 microprocessor, connected to a conventional microprocessor bus 102. Other devices are connected to the bus 102, and are suitably addressed by the microprocessor 100, as is conventional in such systems. These devices include a random access memory (RAM) 104 in which data are stored and, in some cases, program instructions for the microprocessor 100; and a read only memory (ROM) 106 which includes program instructions for the microprocessor 100 or, at the very least, minimal start-up instructions. In some cases, a substantial part of the program instructions for the microprocessor 100 reside in the RAM 104, and these instructions can from time to time be downloaded from the base unit 58 to the portable data collector 56 via the data link 66 (which may comprise a memory card). This allows programming improvements to efficiently be effected, without requiring the replacement of internal components such as the ROM 106.

Other devices connected to the microprocessor bus 102 include a user keypad 108, a serial communications port 110 for connection to the data link cable 64, and a display device 112 (likewise also depicted in FIG. 2A). Preferably, the display device 112 is a liquid crystal display, such as an Epson Model No. EG4401Y-ER.

The portable data collector 56 additionally includes an instrumentation interface, generally designated 114, in communication with the bus 102 and to which various sensors and probes of the FIG. 2A set 52 may selectively be connected through the connector 76. It will be appreciated that the instrumentation interface 114 is conventional, and is suitable for receiving both digital and analog signals from the various sensing devices of the set 52. Thus, the instrumentation interface 114 includes appropriate signal conditioning circuitry, and an analog-to-digital convertor.

Finally, a battery power supply 116 supplies power to the remaining elements through representative power supply conductors 118 and 120.

Figure 3A:
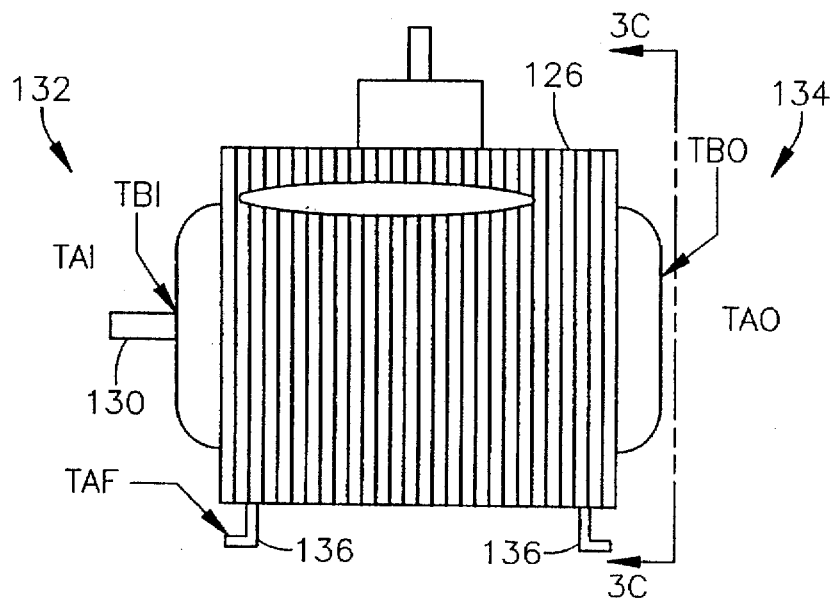
FIGS. 3A, 3B and 3C illustrate the locations of temperature and flux coil measurements on a typical electric motor.
Figure 3C:
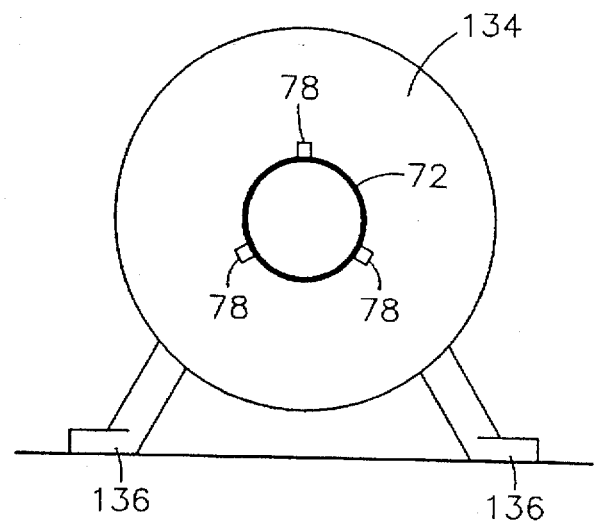
Figure 3B:
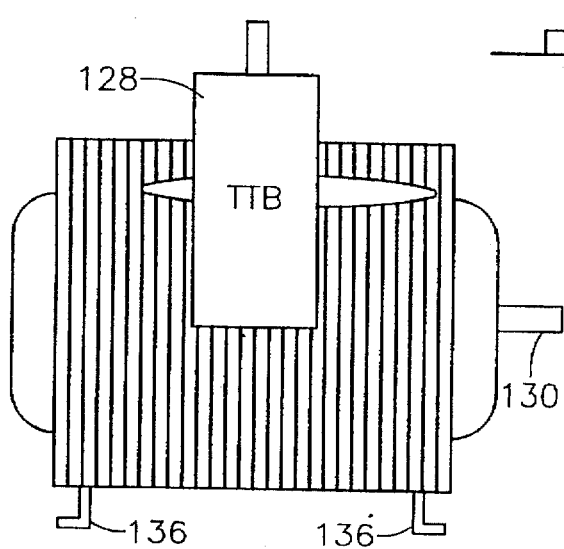

FIGS. 3A, 3B and 3C are two side views and an end view of a typical motor, illustrating locations for various temperature and flux coil measurements.

The motor 126 has a motor termination box 128 comparable to the termination box 26 of the FIG. 1 motor 20, and a driving shaft 130 projects from one or both ends of the motor 126. By definition, the end 132 of the motor with the shaft 130 connected to the load (not shown) is termed the inboard end, and the other end 134 is termed the outboard end. The flux coil 72 is secured to the outboard end 134 by the magnets 78 or other mounting device preferably in a centered axial position, which position preferably is clearly marked for repeatability. If the center position is not accessible, then an off-center position is acceptable.

The motor 126 additionally has mounting feet 136 which, although attached to the motor 126, are a convenient point for measuring ambient temperature, provided no air blows over the feet 136 as a result of motor ventilation.

Three-letter abbreviations for various temperature measurement points indicated in FIGS. 3A and 3B are defined in accordance with the following table:

TABLE—MOTOR TEMPERATURE MEASUREMENT POINTS

TSI Skin temperature inboard
TSC Skin temperature center
TSO Skin temperature outboard
TBI Inboard bearing temperature
TBO Outboard bearing temperature TTB Skin temperature of termination box
TAF Ambient air temperature taken on the motor foot
TAO Ambient air temperature taken outboard of the motor
TAI Ambient air temperature taken inboard of the motor.

There are a number of practical considerations involved in making the temperature measurements as summarized in FIGS. 2A and 2B and in the foregoing table. These practical considerations or preferred measurement practices are discussed in detail below.

Since motor temperatures are higher than the surrounding environment, motor-generated heat transfers to cooler ambient air. How the heat is transferred affects the operation of the motor. Factors that affect the rate of heat transfer include frame material, frame surface area, airflow through and over the motor, ambient air density, and the type of motor enclosure.

While the frame material and surface area cannot be altered, anything that restricts the flow of air has a direct effect on the ability of the motor to transfer heat away. The most common deterrents are grime and dirt, the effect of which is twofold. If air inlets become clogged, less air flows, and less heat is transferred away from the motor. If debris is allowed to accumulate on the motor, layers of filth tend to act as an insulator, thereby impeding heat transfer to the ambient air. As a result of these impedances, the temperature of the motor shell (skin temperature) and the outlet air increase.

Factors other than diminished airflow can also cause an increase in motor temperature. One such factor is excessive internal heat generation. Sources generating heat include faults in the stator or rotor, excessive load, and variations in supply voltage. Faults in the stator or rotor are generally due to shorted lamination, shorted windings, or broken rotor bars. Shorted lamination and windings appear as "hot spots", while broken rotor bars produce a dynamic heat source because such rotor bars produce heat sources which rotate with the rotor. Increasing load produces increasing current and, with excessive load, the increased current produces excessive heat.

Prolonged exposure to excessive loads reduces the life of the insulation system due to increased current. All of the foregoing conditions, if detected in accordance with the invention, can be remedied, thus prolonging the life of the motor.

To briefly summarize, skin and outlet air temperature increase as a result of external impedances restricting proper heat dissipation, extra internal heat generation, high ambient temperatures (greater than 40° C.) and/or high altitudes (greater than 3300 feet). By monitoring temperature, one is able to trend basic conditions of the motor. When skin and outlet air temperatures increase (provided load and ambient air temperature are constant), then maintenance action to determine the source of a potential problem is warranted.

Both the air outlet and skin temperatures provide valuable information. One consideration addressed in accordance with the invention is whether one measurement provides more information than the other, or whether both are needed to effectively evaluate motor condition. As noted hereinabove, one of the objects of the invention is to monitor, with a portable system, as few parameters as possible without sacrificing needed information.

Both air outlet and skin temperatures directly reflect motor inner core temperatures. Measurements of skin temperature can easily and quickly be taken with infrared thermometers or thermocouples, since the temperature is taken off a relatively massive structure which is at an equilibrium temperature. On the other hand, air outlet measurements take more time because some metal object (whether it is a thermocouple or piece of aluminum foil) must be heated by the outlet air before accurate temperatures can be recorded.

Experiments relating to the development of the present invention have revealed that skin temperature measurements consistently track outlet air temperature measurements. While the actual temperatures are not the same, their relative changes from motor to motor demonstrate the same patterns. Therefore, since skin temperature measurements are easier and faster to acquire, air outlet temperatures do not need to be taken. Accordingly, in accordance with the invention it is considered preferable to take skin temperature measurements; however, it will be appreciated that the principles of the invention apply to outlet air temperature measurements as well. In addition, direct stator winding temperature measurements can be employed.

It should also be mentioned that there are two basic groups of motor enclosures, open and totally enclosed. An open type motor is defined by the National Electrical Manufacturers Association (NEMA) "as one having ventilation openings which permit passage of external cooling air over and around the windings of the machine." Totally enclosed motors are defined by NEMA as "so enclosed as to prevent the free exchange of air between the inside and the outside . . . ." Therefore, air is not directly passed over the stator windings. Instead, air is directed to flow over the motor housing in order to remove heat.

Temperature measurements from both groups of motors can provide valuable information for trending purposes. In practice, the type of motor enclosure must be known in order to determine what kinds of temperatures to expect. However, there are certain motor sub-classes where skin temperature measurements are not practical, although actual stator temperature measurements can be used. Examples of such motors are Type I and II weather-protected open type motors, as well as pipe-ventilated, water-cooled, air-water-cooled and air-to-air-cooled totally enclosed machines.

Many instruments are available for measuring temperature, including motor temperature and ambient temperature. Two measuring devices, infrared thermometers, such as infrared thermometer 70 of FIG. 2A (IR probe), and thermocouples, such as the thermocouple 68 of FIG. 2A, are easy to use and relatively inexpensive, and each of these temperature measuring devices may be employed to measure either motor temperature or ambient temperature. Temperatures can be taken with IR probes more rapidly. However, the IR probe must acquire temperature on surfaces of known emissivity. Uncertainties regarding emissivity can be overcome by using black tape or black spray paint (emissivity approximately equal one) on objects to be measured.

When acquiring skin temperature measurements, many data points would be required to accurately map the entire surface. However, in order to reduce data collection times, fewer measurements are preferred. As a compromise, in the practice of the invention three skin temperature points are recommended. These points should be well marked, usually with paint, to eliminate error associated with the repeatability of the location. For example, due to bracketing and support structures internal to a motor, not readily apparent from the outside, motor skin temperature may vary significantly from one point to another just a few inches away, particularly if one of the points is over an area where an internal structure is attached to the motor skin.

The skin temperature measurement points should be positioned where the motor housing is closest to the stator. For motors with box type housings, air within the motor heats the housing. Trendable data is possible since each measurement point tracks the general heating and cooling within the stator. Regardless of the shape of the motor housing, the three measurement points should be positioned over the stator, making sure points are not outside of the stator area, over an open air space. One measurement point should be placed in the middle, with the other two on either side towards the edge of the stator area. For totally enclosed motors, the measurement points should be placed on flat surfaces, and not on the cooling fins.

It will accordingly be appreciated that FIGS. 3A and 3B and the TABLE of Motor Temperature Measurement Points hereinabove represent a summary of these various considerations and preferred measurement practices.

A reference temperature is needed in order to calculate relative temperature rise for the skin of the motor. Both the ambient air temperature and motor foot temperature are recommended as reference temperatures. If using an IR probe, the ambient temperature can be measured by suspending a strip of aluminum foil painted black in midair, and measuring the temperature of the foil; or simply measuring the temperature of a piece of metal on a stationary object near the motor. If using a thermocouple, it is important to ensure that enough time has elapsed so that the thermocouple junction reaches equilibrium with the ambient air. The temperature at the motor foot or base can be measured in a manner similar to measuring of skin temperatures, and generally is not particularly influenced by the temperature of the motor body. In general, the temperature of a motor foot tracks the ambient air, and often is the same as ambient air temperature, provided outlet air form motor ventilation does not blow over the foot.

Even though monitoring skin temperature is relatively simple, certain factors can influence the reading, potentially resulting in incorrect interpretation. Factors to be considered are the effects of load, ambient air, heat generated by the sun and the location of measurements.

Motor temperature rise is a function of bearing friction, windage, core loss, copper losses (referred to $I^2R$ losses), and stray losses. Only stray and $I^2R$ losses vary with motor load. Since $I^2R$ is basically dissipated power, the temperature rise changes roughly proportional to power dissipation. Therefore, because smaller loads require less current, less heat is generated, and larger loads result in higher temperature rises.

Figure 4:
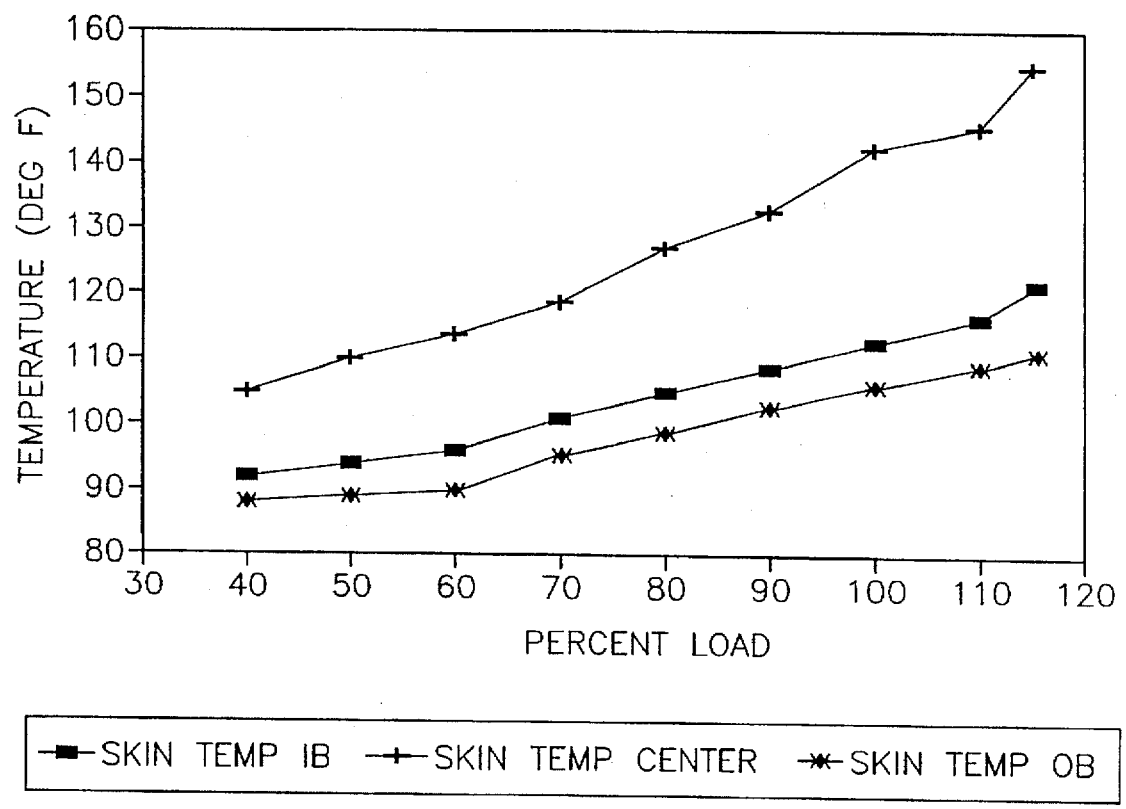
FIG. 4 is a plot of motor skin temperature measurements relative to increasing load.

FIG. 4 is a graph showing the change in skin temperature for a motor at various load percentages. So long as the motor load required is constant, significant changes in skin temperature would indicate a problem. However, if load were to increase, then temperature would increase even though the motor is not experiencing problems. Therefore, in accordance with the invention, when trending temperature data, the load of the motor is taken into account before inferring potential problems.

Ambient air influences two aspects of motor cooling. The major effect of ambient air is on the inlet air temperature. If the inlet air is warmer, it has less capacity for cooling the stator. As NEMA states, "Abnormal deterioration of insulation may be expected if the ambient temperature of 40° C. is exceeded in regular operation." Ambient air temperature has a second aspect which influences skin temperature measurements. In general, the temperature of a piece of metal changes until it reaches ambient air temperature (provided no heat is added to the metal). If the piece of metal is heated (e.g. motor skin), the temperature of the metal is warmer for higher ambient air temperatures, and cooler for lower ambient air temperatures. Therefore, when measuring skin temperature, one must be aware of the ambient air temperature. For the same internal heat source of a given temperature, skin temperature varies according to ambient air temperature. Thus, while rising skin temperature generally points to potential faults, the increased temperature may be simply due to warmer ambient air temperature.

Another influence on skin temperature is the effect of solar heating. For the same ambient air temperature (temperature taken in shade) a piece of metal is warmer in direct sunlight than when in the shade. Therefore, the skin temperature for a measurement point in the shade appears less than for a measurement point in the sun, even though the motor itself is generating the same heat load. The color, thickness and metal properties also have an effect on the skin temperature measurement. To avoid or minimize the effect of radiant heating by the sun for outside motors, temperature measurements should be acquired below the horizontal center line, and on the shaded side.

A final factor influencing skin temperature measurements is the location. In general, the warmest spots on a motor are where the mass is greatest, and airflow is smallest. Therefore, the warmest section on motors with open enclosures is generally in the middle; while the warmest section on totally enclosed motors is somewhere between the middle and the end farthest from the fan (Totally Enclosed Fan Cooled (TEFC) type motors). In general, a "horizontal" temperature gradient is shaped like a bell curve, where the warmest temperatures are in the middle, with cooler temperatures towards the outer ends of the motors. Temperatures also vary about the circumference of the motor because of airflow patterns within the motor. In addition, the distance between the stator and shell of a motor are not the same around the total circumference. The closer the motor case is to the stator, the more reliable and repeatable the data. Because skin temperature is different at various points on the motor, it is important that measurement points be marked so that trend data may be taken on closely repeatable locations. These measurement points should be placed where a distance between the stator and motor case is smallest.

In accordance with the invention, a normalized temperature rise parameter is employed in order to negate the effects of ambient air and load. As noted hereinabove, motor skin temperature is a function of stator temperature, ambient air temperature and load. Thus, skin temperature measurements alone are not an accurate reflection of whether a problem exists.

The normalized thermal parameter of the invention is defined in accordance with the following formula:

$$T_N = \frac{T_{skin} - T_{amb}}{\% \text{ load}} \times 100$$

where:

$T_N$=normalized thermal parameter (normalized temperature rise)

$T_{skin}$=measured motor skin temperature averaged over the measurement points, or other motor temperature measurement point $T_{amb}$=measured ambient air temperature, or other appropriate reference point % load=percent full load of motor at measurement time.

Thus, the normalized temperature rise parameter $T_N$ is a function directly related to the difference between motor temperature and ambient temperature, and is inversely related to motor load. Because the skin temperature is influenced by the ambient air, a relative temperature is obtained by subtracting the ambient air temperature from the measured skin temperature. To account for changes in load, it is recognized that temperature rise is proportional to power dissipated.

With reference to FIG. 2A, the measurement data to calculate the normalized temperature rise parameter as defined above is acquired in accordance with the measurement practices detailed hereinabove either employing the thermocouple probe 68, or the infrared thermometer 70, connected to the portable data collection device 56 and interfaced to the FIG. 2B instrumentation interface 114. Either the calculations can be performed by the microprocessor 100 within the portable data collection device 56, or the raw temperature data can be stored within the RAM memory 104, and later transferred via the data link 66 to the base unit 58 for subsequent calculation. In either event, the calculated normalized temperature rise parameter $T_N$ is stored as a reference for a particular motor for subsequent comparison in a trending process.

Statistical thresholds or alarm limits may be set for trended parameters via a statistical approach, such as setting alarm limits at three standard deviations from the mean value or employing a non-parametric test. Absolute thresholds may be defined based on motor vendor data or field experience.

In addition, alarm limit thresholds may be calculated based on the insulation rating of a particular motor, although some uncertainties may result from this approach. Thus, thresholds can vary depending upon the type of insulation and frame, and heat transfer from stator to skin varies due to motor construction.

Both statistical and absolute thresholds are applied. It is possible to exceed an absolute threshold without exceeding a statistical threshold. In the event a statistical threshold is exceeded, it is important to recognize that it is possible to have a low value for $T_N$ which is so small that no action should be taken. Therefore there is also a minimal absolute threshold which $T_N$ must exceed before any action is taken.

As an example illustrating how the normalized thermal parameter $T_N$ can be calculated and used, consider an open drip proof motor with a "B" class insulation operating at 80% load in an ambient temperature of 30° C. The skin temperature at the center of the motor is measured to be 80° C. An absolute normalized threshold for this particular motor is 52° $C._n$, where ° $C._n$=normalized temperature. For the actual skin measurement of 80° C. at 80% load, the normalized thermal parameter value is 62.5° $C._n$ (calculated as (((80−30)/80)×100)=62.5° $C._n$). This exceeds the alarm limit. Therefore, the winding temperature is probably above the rated limit. Even though the measured skin temperature is not greater than the temperature limit of the insulation, the motor is operating too hot for the present ambient temperature and load.

In addition to motor skin, motor bearings tend to be excessively heated during abnormal operation, and bearing temperature measurement points accordingly are also influenced by ambient temperature and motor load so that calculation and use of the normalized temperature rise parameter $T_N$ as defined above is desirable.

Briefly considering bearing temperature, when lubrication quality changes, increased friction usually results. This produces thermal energy which increases in a non-linear fashion. In addition, any heat generated from the motor warms the lubricant. If the heat is too great, the thermal properties of the bearing lubrication can be exceeded and bearing degradation occurs. Therefore, not only do bearings produce heat, but they are also affected by heat. Since bearings heat during normal operation as a function of load, use of the normalized temperature rise parameter $T_N$ is desirable when monitoring or trending for possible faults.

The best method of measuring bearing temperature is to measure the bearing directly. However, temperature probes are often not mounted on bearings. Therefore, an alternative is to measure bearing temperature on the bearing housing. Provided the transmission between the housing and the bearing is satisfactory, trending bearing "skin" temperature is beneficial. While this method should not replace vibration analysis, it can assist in the prediction of bearing life and lend support for the vibration study. In addition, it may point to some faults that are missed by other methods.

When collecting temperature data on the bearing housing, the same procedural care discussed hereinabove for skin temperature measurements applies. The threshold limits are as described for skin temperature measurements.

Other measurement points where excessive temperature indicates problems are located at the terminal housing box 26 and the shaft coupling 24. Load however does not significantly affect temperature measurements at these points, but ambient air does. Accordingly, the normalized thermal parameter $T_N$ is still used, but the load is assumed to be 100%, regardless of the actual load. So the normalized thermal parameter $T_N$ is affected only by ambient air temperature.

Briefly considering the skin temperature of the motor termination box (26 in FIG. 1 and 128 in FIG. 3B) the motor termination box is located at the motor and houses the junction at which conductors from power lines are connected to the supply lines of the motor. The heat generated from this junction can change due to high resistance joints, corrosion, improper make-up of metals, water or other intrusive substances. Regardless of the cause, the skin temperature of the termination box "tracks" the changes in temperature due to conductor junction faults.

While thermography is perhaps the best method to determine precisely where a fault occurs, trending skin temperature changes on the termination box can indicate possible problems. The procedures for acquiring this measurement are as described above. It is important to ensure data is always taken from the same location. Caution must be employed when termination boxes are located directly in the sun. Direct sunlight can produce high skin temperatures at the measurement point that are not indicative of internal heating. For trended data, a statistical threshold for the normalized thermal parameter can be alarmed for variations of three standard deviations from the mean or a non-parametric test. Absolute thresholds may be defined based on motor vendor data or field experience.

Briefly considering shaft coupling 24 temperature, a shaft coupling 24 heats up primarily due to misalignment. In addition, a defective shaft coupling 24 can heat excessively, and the normalized thermal parameter $T_N$ calculated and trended in a manner similar to that of the motor termination box.

In addition to skin temperature or other motor temperature and ambient temperature or other reference, calculation of the normalized thermal parameter $T_N$ as defined hereinabove requires that the motor load percentage be known at measurement time. Actual running speed of a motor is a fairly accurate indication of motor load, as the rotational speed of a motor decreases relatively linearly from the speed at approximately 25% load conditions to rated speed under 100% load conditions.

Calculation of the normalized thermal parameter $T_N$ thus requires that the motor speed be determined. Preferably, speed is determined by performing a frequency spectrum analysis of motor magnetic flux as sensed by the flux coil 72. Nevertheless, other, more direct methods can be employed for speed determination. Examples of devices which may be used for speed determination are strobe lights and tachometers.

Figure 5:
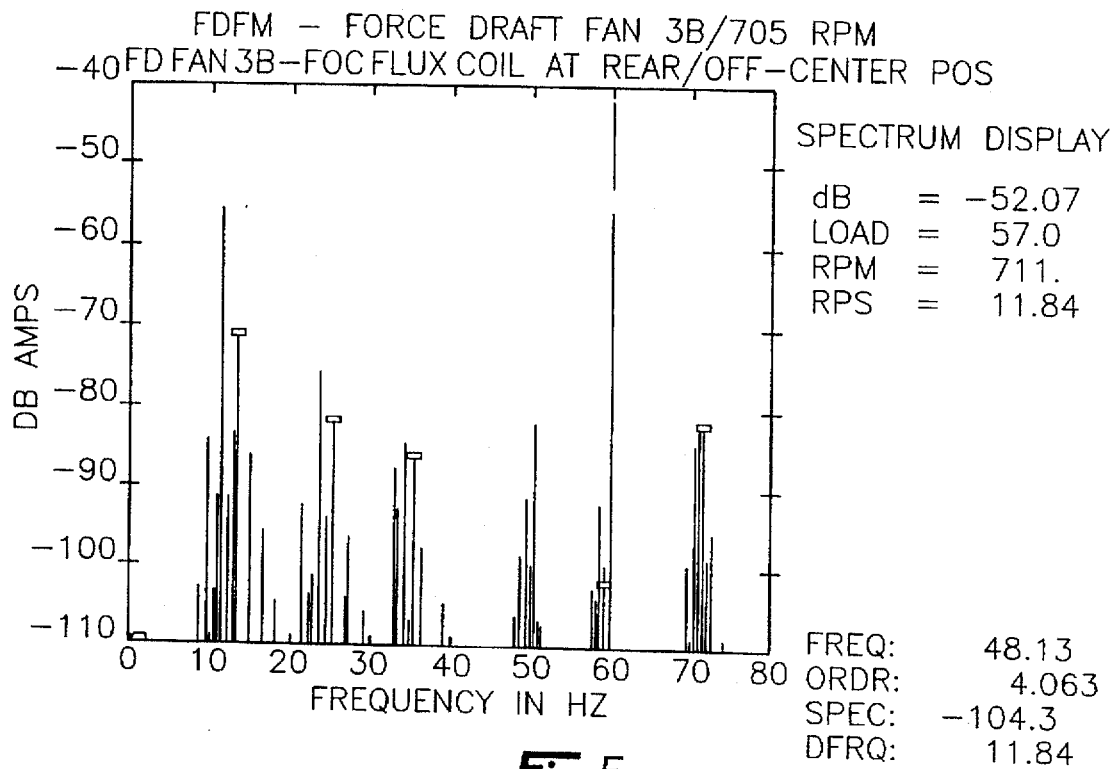
FIG. 5 is a flux spectrum showing running speed sidebands about line frequency, useful in determining motor speed.
Figure 6:
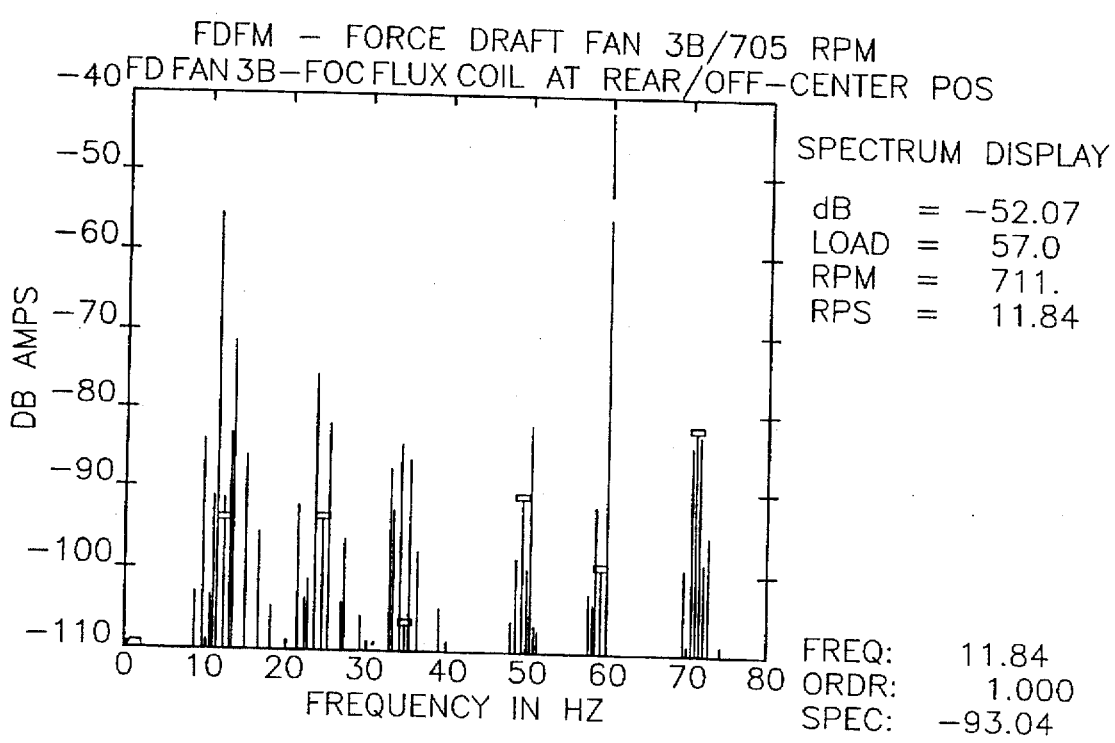
FIG. 6 is a flux spectrum similar to that of FIG. 5, but with the cursor highlighting showing running speed and harmonics.

One approach for determining motor speed is disclosed in Kliman et al U.S. Pat. No. 4,761,703, which describes the calculation of slip frequency by performing a Fast Fourier Transform (FFT) on axial flux data, and then finding the maximum FFT bin of the resulting flux spectra in a predefined frequency range, typically between 0.1 Hz and 1.5 Hz. However, a preferred technique for determining motor speed by performing a frequency spectrum analysis of motor magnetic flux is disclosed in concurrently-filed Bowers et al application Ser. No. 08/320151, filed Oct. 7, 1994 entitled "Induction Motor Speed Determination by Flux Spectral Analysis", the entire disclosure of which is hereby expressly incorporated by reference. Very briefly, a typical spectrum from a flux coil measurement is shown in FIGS. 5 and 6, which are for a particular motor. (The actual frequency spectra are identical in FIGS. 5 and 6. FIGS. 5 and 6 differ in the cursor positions.) In FIG. 5, the cursor positions are on running speed sideband family members about line frequency, which sidebands occur every 11.84 Hz above and below line frequency. In this particular example line frequency is 59.97 Hz. In FIG. 6, the leftmost cursor position is on the running speed frequency of 11.84 Hz, and the remaining cursor positions are on harmonics of the running speed frequency.

In the example of FIGS. 5 and 6, the running speed frequency is 11.84 Hz, which is equivalent to 11.84 RPS, which is 710.4 RPM.

Thus, in general as illustrated in FIGS. 5 and 6, peaks occur generally at running speed and harmonics, and the peaks may also be accompanied by sidebands spaced by slip frequency, and slip frequency multiples. Other peaks arise at running speed sidebands and slip frequency sidebands (along with associated multiples) about line frequency. Even though peaks associated with running speed may not be the largest peaks within their group of peaks, they can be utilized to arrive at the running speed in accordance with the techniques described in greater detail in the above-incorporated application Ser. No. 08/320151.

By knowing the running speed, an estimate of the load can be derived and entered into the calculation of the normalized thermal parameter as discussed hereinabove.

Since the running speed can be difficult to find if the spectrum is collected with insufficient resolution or frequency range, the minimum resolution recommended is in the order of 0.06 Hz/division, while the frequency range should be greater than two times line frequency and greater than three times running speed in revolutions per second.

In addition to allowing speed and thus motor load to be determined, the flux coil spectrum can also be employed to provide information on rotor bar condition, as well as other faults which alter the electrical characteristics of a motor. Thus, FIG. 7A depicts a flux coil spectrum in the vicinity of a 60 Hz nominal line frequency of a motor in normal condition, while FIG. 7B shows a flux coil spectrum in the vicinity of the 60 Hz nominal line frequency of the same motor, but with broken rotor bars.

Figure 7A:
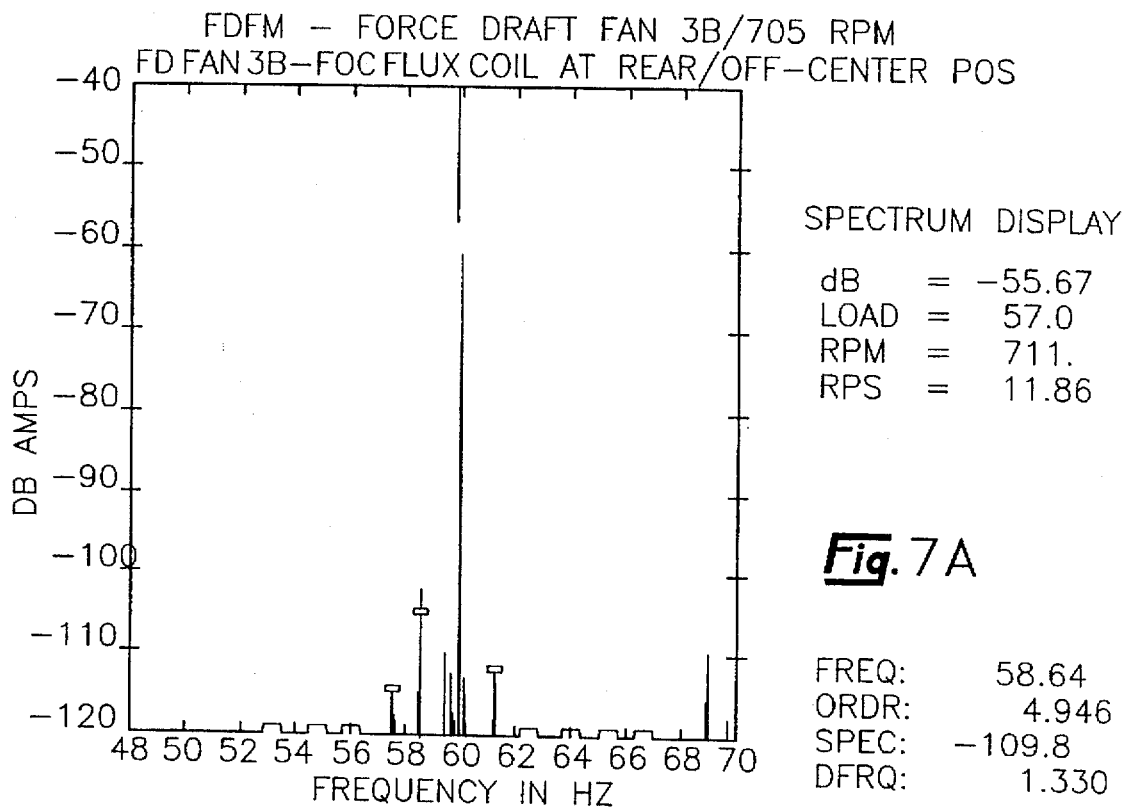
FIG. 7A is a flux spectrum showing sidebands about line frequency of a motor in proper condition.

In the FIG. 7A plot of the motor under "normal" conditions, the line frequency amplitude is −55.71 dB, and the exemplary marked sideband at 58.64 Hz has an amplitude of −109.8 dB, which is down by 54.1 dB. However, in the FIG. 8B frequency spectrum of the motor with a broken rotor bar, the line frequency amplitude (at a frequency of 59.973 Hz) is nearly the same, −53.94 dB, while the amplitude of the exemplary marked sideband at 58.48 Hz is −88.92 dB, down only 34.98 dB. Thus, trending this data provides the ability to detect rotor problems. (Trending of the data is considered necessary, since absolute threshold values for flux coil measurements vary for different induction motors.)

Figure 7B:
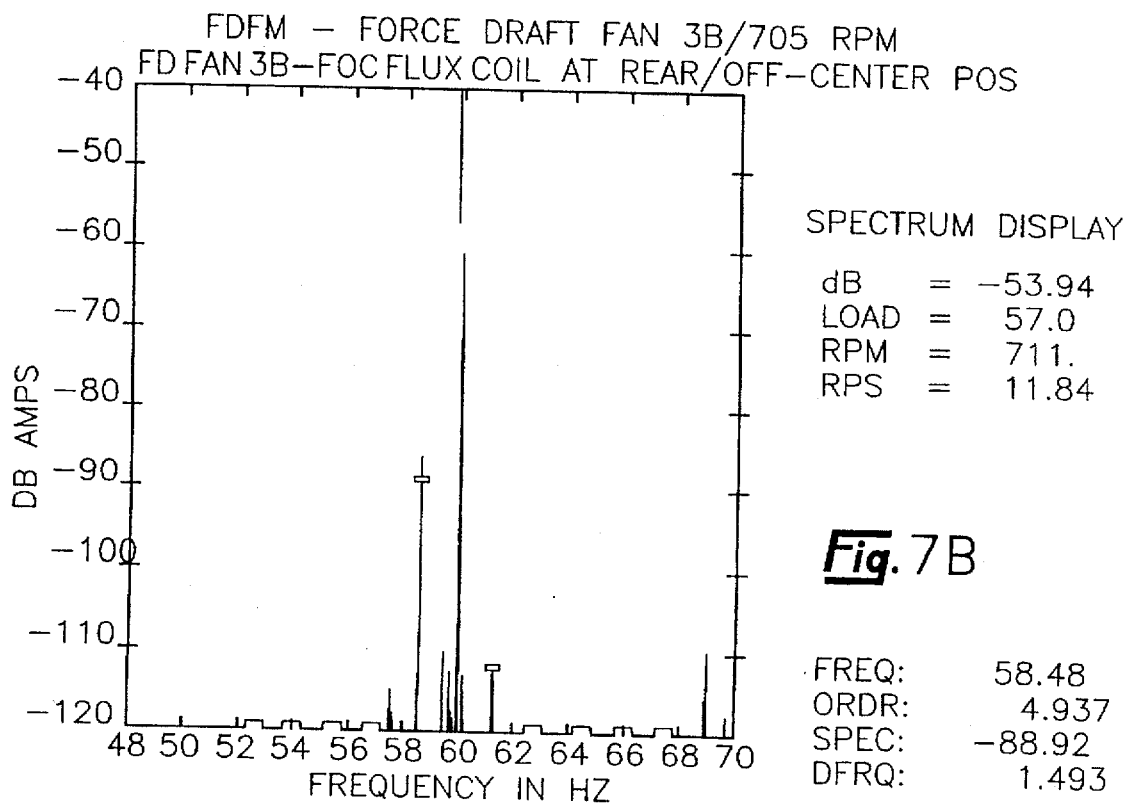
FIG. 7B is a flux spectrum of the same motor with broken rotor bars.

While comparison of the plots of FIGS. 7A and 7B appears superficially to be straightforward, in practice difficulties in interpretation arise due to an "accordion effect" whereby the various peaks in the frequency spectra of FIGS. 7A and 7B, as well as that of FIGS. 5 and 6, spread in or out depending upon the actual motor load and slip frequency. The peaks or identities for comparison depend on three variables, speed (load), slip and line frequency. Slip is inversely related to speed, while speed and slip are both functions of line frequency. Peaks, related to speed, slip or line frequency, change with change in any of these variables. The identities can appear as fundamental or harmonic frequencies, modulated frequencies, while line frequency and rotational speed can appear as carrier frequencies. Identity peak frequencies increase or decrease as the above variables change, thus producing an "accordion effect" about carrier frequencies.

In accordance with the invention the various peaks are determined based on predetermined identity criteria, rather than by absolute frequency. Thus, while each of the peaks of FIGS. 7A and 7B is characterized by a frequency and an amplitude, the relevant peaks are not located at particular absolute frequencies. For example, in FIG. 7A, the relevant sideband peak has a frequency of 58.64 Hz, while in FIG. 7B the same peak (by identity) has a different frequency, which is 58.48 Hz. While the frequencies of corresponding peaks in FIGS. 7A and 7B do not differ greatly in this particular example, in some cases they do. In any event, it is not possible to take the absolute frequency of a given peak in FIG. 7A for the motor in good condition, e.g. 58.64 Hz, and at a later time determine the amplitude at the same frequency of 58.64 Hz to derive any meaningful information.

While various identity criteria may be established, preferably, in accordance with the invention, the particular identity criteria are integer multiples and submultiples of the product of the number of motor poles and the slip frequency (NP×SF) as sidebands on either side of the line frequency. Thus, in FIG. 7A, the line frequency is 9.97 Hz, and NP×SF sidebands are spaced every 1.330 Hz on either side of the line frequency. In FIG. 7A, most of these sidebands have an amplitude below −120 dB, and thus are represented as small rectangles along the base line.

Expressed mathematically, these particular sidebands presently preferred occur at the following intervals on either side of the AC line frequency:

. . . , (NP×SF)/4, (NP×SF)/2, (NP×SF), (NP×SF)×2, (NP×SF)×4, . . .

where

NP=the number of poles

SF=slip frequency

In FIGS. 7A and 7B, the highlighted sideband at 58.64 Hz in FIG. 7A and 58.48 Hz in FIG. 7B is NP×SF below line frequency.

For trending and other subsequent comparison purposes, the data processing system 54 comprising the portable data collector 56 and the base unit 58 maintains a record of the frequency spectrum analysis over a period of time. This record may be maintained in a variety of ways. One convenient way is to maintain a record of the amplitude of each of the peaks organized by identity, preferably in the base unit 58. The individual amplitudes of the subset of peaks at one point in time can be compared, by identity, with the individual amplitudes of the subset of peaks at a different point in time to identify a change in motor condition, such as a broken rotor bar.

As noted hereinabove, the various data processing functions can be distributed between the data collector 56 and the base unit 58 in any appropriate manner. One example is to compute the FFT in the data collector 56, and to subsequently analyze the various peaks in the base unit 58.

It should be noted that in the practice of the invention, it is not necessary to acquire spectral data over an extended frequency range. Thus, the frequency range should be greater than two times line frequency and three times running speed.

Although not specifically illustrated herein, it should be noted that consistency and repeatability in flux coil mounting is important. While all of the various sideband peaks mentioned above may be present to some extent regardless of the particular flux coil mounting, the relative amplitudes of the peaks is relatively sensitive to flux coil positioning. Thus, flux coil measurements should be acquired at a repeatable place, preferably at a centered point on the end of the motor, and the flux coil should be held so that sensor movement is inhibited. Thus in FIG. 2A a mounting device in the form of representative magnets 78 advantageously holds the flux coil 72 firmly in position, which position on each particular motor should be marked for repeatable results.

In addition, an electric current measurement should be made to verify broken rotor bars.

Figure 8:
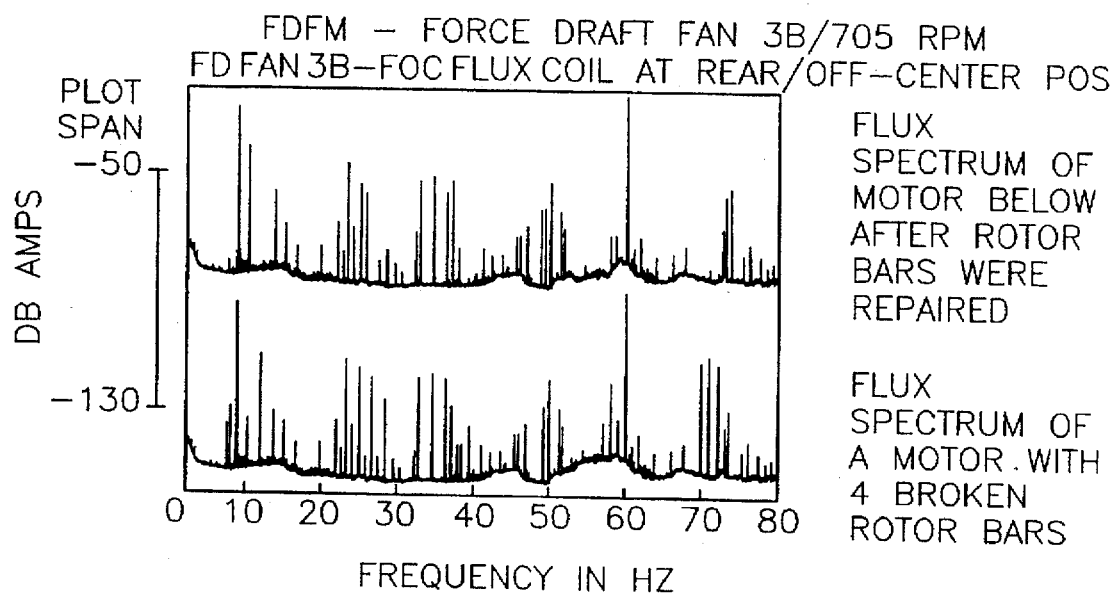
FIG. 8 is a flux spectrum of the same motor before and after a rotor repair, but over a greater frequency range than FIGS. 7A and 7B.

FIG. 8 is a flux coil spectrum of the same motor before and after a rotor repair, differing from FIGS. 7A and 7B only in that a greater frequency range is shown. Thus, in FIG. 8 the frequency range plotted is 0 Hz to 80 Hz, compared to 48 Hz to 70 Hz in FIGS. 7A and 7B.

From FIG. 8 it will be appreciated that there are many peaks in the flux coil spectrum, a number of which are yet to be explained. It is believed that harmonics of line frequency and their surrounding peaks can provide information for diagnostic purposes. One thing which does seem to be apparent is that, as electrically-related faults in a motor increase, additional sidebands appear about running speed and line frequency peaks (provided correct measurement techniques are employed). In FIG. 8, the bottom spectrum has many more peaks at larger amplitudes compared to the upper spectrum. Data for the bottom spectrum was acquired when the motor had broken rotor bars. The top spectrum was produced from data taken after the rotor had been repaired. The overall energy for the bottom spectrum is −52.07 dB while overall energy for the top spectra is −53.55 dB. Even though the overall spectral energy does not change significantly, additional sidebands are very evident for the motor before the rotor bar problem was corrected.

The apparatus of the invention preferably implements "routing". Thus, a route to be followed by the user is loaded into the data processing system 58, typically downloaded from the base unit 60 to the portable data collection device 56. By means of the liquid crystal display 112 on the portable data collector 56, the user is prompted regarding particular equipment from which temperature, flux and/or speed and shaft current measurements are to be taken. Further, the portable data collector 56 is also operable to suggest to the user possible problems and appropriate remedial actions based on analysis of data collected. By means of prompts on the display 112, the user is prompted regarding particular measurements to be taken, thus facilitating the collection of complete and accurate data.

From the foregoing, it will be appreciated that the apparatus of the invention in a single package automates the collection and evaluation of temperature, flux, speed and shaft current measurements. Motor speed can be determined directly or from flux measurements. A normalized thermal parameter is calculated. In addition, qualitative user input is evaluated, in particular the relative cleanliness of the motor (e.g. "looks new," "dusty," "considerable buildup" or "heavy buildup") and air flow through the motor (e.g. "high flow," "expected moderate flow," "minimal flow" or "no detectable flow").

By trending temperature, magnetic flux and shaft current measurements, the general condition of a motor can be predicted. Excessive heat is the main factor responsible for shortening the life of motors. Heat mostly effects the life of the insulation system and bearings. Therefore, trending temperature can provide early indication of premature degradation. The magnetic flux for a given motor varies with changes in the electrical characteristics. Magnetic flux analysis can recognize electrically related faults, as well as enable motor speed determination. Motor speed can be used to calculate a relative value for load. Ideally, electric currents in a motor shaft should be minimal. Presence of such currents will cause bearings to prematurely fail. Therefore, measuring shaft currents is valuable.

A frequency spectrum analysis of motor magnetic flux is performed to find a set of peaks each characterized by a frequency and an amplitude, and to identify a subset of peaks in accordance with predetermined identity criteria for purposes of comparison. A record of the frequency spectrum analysis is maintained over a period of time for recognizing a change in the condition of the motor.

"Expert system" capabilities are also provided. Thus the apparatus evaluates the parameter values from all measurements and provides a recommendation of possible problems and appropriate remedial actions if warranted. Such recommendations can be provided via the video display 64.

While specific embodiments of the invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. Apparatus for monitoring the condition of at least one AC induction motor, said apparatus comprising:

a motor temperature measuring device for measuring the temperature of at least one motor temperature measurement point during motor operation;

an ambient temperature measuring device;

a magnetic flux transducer for sensing magnetic flux generated by the motor during motor operation; and a data processing system arranged to receive data from said motor temperature measuring device, from said ambient temperature measuring device, and from said magnetic flux transducer;

said data processing system being operable to determine motor load based on sensed magnetic flux and to calculate a normalized temperature rise parameter as a function directly related to the difference between motor temperature and ambient temperature and inversely related to motor load, and being further operable to perform a frequency spectrum analysis of motor magnetic flux to find a set of peaks each characterized by a frequency and an amplitude, and to identify from the set of peaks a subset of peaks in accordance with predetermined identity criteria for purposes of comparison.

2. Apparatus in accordance with claim 1, wherein said data processing system is distributed and comprises a portable data collector and a base unit capable of at least periodically being linked for data transfer.

3. Apparatus in accordance with claim 1, wherein said data processing system is further operable to maintain a record of the calculated normalized temperature rise parameter for trending the calculated normalized temperature rise parameter over a period of time, and is further operable to maintain a record of the frequency spectrum analysis over a period of time for recognizing electrical changes in the motor.

4. Apparatus in accordance with claim 1, wherein said data processing system determines motor load by performing a frequency spectrum analysis of motor magnetic flux to determine motor speed, and then employs motor speed as a basis for calculating motor load.

5. Apparatus in accordance with claim 1, wherein said magnetic flux transducer comprises a formed flux coil including a mounting device for retaining said formed flux coil in position on the motor.

6. Apparatus in accordance with claim 1, wherein said data processing system is further operable to store routing information relating to particular AC induction motors to be inspected, and includes a display for prompting a user of said apparatus regarding the particular AC induction motors to be inspected.

7. Apparatus in accordance with claim 1, wherein said data processing system is further operable to provide to the user a recommendation of possible problems and appropriate remedial actions.

8. Apparatus in accordance with claim 1, which further comprises a shaft current probe, and wherein said data processing device is arranged to receive signals from said shaft current probe.

9. Apparatus in accordance with claim 8, wherein said data processing system is further operable to maintain a record of shaft current data for trending shaft current data over a period of time.

10. Apparatus in accordance with claim 8, wherein said data processing system is operable to perform a frequency spectrum analysis of signals from said shaft current probe.

11. Apparatus for monitoring the condition of at least one AC induction motor, said apparatus comprising:

a motor temperature measuring device for measuring the temperature of at least one motor temperature measurement point during motor operation;

an ambient temperature measuring device;

a magnetic flux transducer for sensing magnetic flux generated by the motor during motor operation; and a data processing system arranged to receive data from said motor temperature measuring device, from said ambient temperature measuring device, and from said magnetic flux transducer;

said data processing system being operable to determine motor load based on sensed magnetic flux and to calculate a normalized temperature rise parameter as a function directly related to the difference between motor temperature and ambient temperature and inversely related to motor load.

12. Apparatus in accordance with claim 11, wherein said data processing system is distributed and comprises a portable data collector and a base unit capable of at least periodically being linked for data transfer.

13. Apparatus in accordance with claim 11, wherein said data processing system is further operable to maintain a record of the calculated normalized temperature rise parameter for trending the calculated normalized temperature rise parameter over a period of time.

14. Apparatus in accordance with claim 11, wherein the motor temperature measurement point is on the skin of the motor.

15. Apparatus in accordance with claim 11, wherein the motor temperature measurement point is on a motor bearing.

16. Apparatus in accordance with claim 11, wherein said motor temperature measuring device comprises an infrared thermometer.

17. Apparatus in accordance with claim 11, wherein said motor temperature measuring device comprises a thermocouple.

18. Apparatus in accordance with claim 11, wherein said magnetic flux transducer comprises a formed flux coil including a mounting device for retaining said formed flux coil in position on the motor.

19. Apparatus in accordance with claim 11, wherein said data processing system determines motor load by performing a frequency spectrum analysis of motor magnetic flux to determine motor speed, and then employs motor speed as a basis for calculating motor load.

20. Apparatus in accordance with claim 11, wherein said data processing system is further operable to store routing information relating to particular AC induction motors to be inspected, and includes a display for prompting a user of said apparatus regarding the particular AC induction motors to be inspected.

21. Apparatus in accordance with claim 11, wherein said data processing system is further operable to provide to the user a recommendation of possible problems and appropriate remedial actions.

22. Apparatus for monitoring the condition of at least one AC induction motor, said apparatus comprising:

a motor temperature measuring device for measuring the temperature of at least one motor temperature measurement point during motor operation;

an ambient temperature measuring device;

a device for determining motor speed; and a data processing system arranged to receive data from said motor temperature measuring device, from said ambient temperature measuring device, and from said device for determining motor speed;

said data processing system being operable to determine motor load based on motor speed and to calculate a normalized temperature rise parameter as a function directly related to the difference between motor temperature and ambient temperature and inversely related to motor load.

23. Apparatus in accordance with claim 22, wherein said data processing system is distributed and comprises a portable data collector to which said temperature measuring devices and said device for determining motor speed are connected, and a base unit capable of at least periodically being linked for data transfer.

24. Apparatus in accordance with claim 22, wherein said data processing system is further operable to maintain a record of the calculated normalized temperature rise parameter for trending the calculated normalized temperature rise parameter over a period of time.

25. Apparatus in accordance with claim 22, wherein the motor temperature measurement point is on the skin of the motor.

26. Apparatus in accordance with claim 22, wherein said date processing system is further operable to store routing information relating to particular AC induction motors to be inspected, and includes a display for prompting a user of said apparatus regarding the particular AC induction motors to be inspected.

27. Apparatus in accordance with claim 22, wherein said data processing system is further operable to provide to the user a recommendation of possible problems and appropriate remedial actions.

28. Apparatus for monitoring the condition of at least one AC induction motor, said apparatus comprising:

a magnetic flux transducer for sensing magnetic flux generated by the motor during motor operation; and a data processing system arranged to receive data from said magnetic flux transducer and operable to perform a frequency spectrum analysis of motor magnetic flux to find a set of peaks each characterized by a frequency and an amplitude, and to identify from the set of peaks a subset of peaks in accordance with predetermined identity criteria for purposes of comparison.

29. Apparatus in accordance with claim 28, wherein said data processing system is further operable to maintain a record of the frequency spectrum analysis over a period of time for recognizing a change in the condition of the motor.

30. Apparatus in accordance with claim 29, wherein said data processing system is further operable to maintain a record of the subset of peaks organized by identity.

31. Apparatus in accordance with claim 30, wherein said data processing system is further operable to compare the amplitudes of the subset of peaks at one point in time with the amplitudes of the subset of peaks at a different point in time by identity to identify the change in the motor condition.

32. Apparatus in accordance with claim 31, wherein the change in the motor condition is a broken rotor bar.

33. Apparatus in accordance with claim 28, wherein the motor is powered from an AC power line having a line frequency, the motor has a given number of poles, and the motor is under load rotating with a slip frequency defined as the difference between synchronous speed and motor rotational speed; and wherein the identity criteria comprise integer multiples and sub-multiples of the product of the number of motor poles and the slip frequency as sidebands on either side of the line frequency.

34. Apparatus in accordance with claim 28, wherein said data processing system is distributed and comprises a portable data collector to which said magnetic flux transducer is connected, and a base unit capable of at least periodically being linked for data transfer.

35. Apparatus in accordance with claim 28, wherein said magnetic flux transducer comprises a formed flux coil including a mounting device for retaining said formed flux coil in position on the motor.

36. Apparatus in accordance with claim 28, said data processing system is further operable to store routing information relating to particular AC induction motor to be inspected, and includes a display for prompting a user of said apparatus regarding the particular AC induction motors to be inspected.

37. Apparatus in accordance with claim 28, wherein said data processing system is further operable to provide to the user a recommendation of possible problems and appropriate remedial actions.

* * * * *

UNITED STATES PATENT AND TRADEMARK OFFICE
CERTIFICATE OF CORRECTION

PATENT NO. : 5,680,025

DATED : October 21, 1997

INVENTOR(S) : Stewart V. Bowers, III, et al.

It is certified that error appears in the above-indentified patent and that said Letters Patent is hereby corrected as shown below:

At column 5, line 62 "08/320,196" should read --08/320,196 filed October 7, 1994--.

At column 5, line 62 and 63, "Apparatus for Measuring Electrical Signals on a Rotating Shaft Apparatus" should read --Apparatus for Measuring Electrical Signals on a Rotating Shaft--.

At column 13, line 45, a new paragraph begins "By knowing the running speed....". This should not be a new paragraph, but the last sentence in the preceding paragraph.

At column 14, line 46, "9.97 Hz" should be --59.97 Hz--.

UNITED STATES PATENT AND TRADEMARK OFFICE
CERTIFICATE OF CORRECTION

PATENT NO. : 5,680,025

DATED : October 21, 1997

INVENTOR(S) : Stewart V. Bowers, III, et al.

It is certified that error appears in the above-indentified patent and that said Letters Patent is hereby corrected as shown below:

(continuation)

At claim 1, column 16, line 63, "the" should be changed to --a--.
At claim 7, column 17, line 33, "the" should be changed to --a--.
At claim 11, column 17, line 63, "the" should be changed to --a--.
At claim 14, column 18, line 9, "the" should be changed to --a--.
At claim 21, column 18, line 33, "the" should be changed to --a--.
At claim 22, column 18, line 51, "the" should be changed to --a--.
At claim 25, column 18, line 66, "the" should be changed to --a--.
At claim 27, column 19, line 8, "the" should be changed to --a--.
At claim 29, column 19, line 25, " the" should be changed to --a--.
At claim 33, column 20, line 8, "the" should be changed to --a--.
At claim 33, column 20, line 11, "the" should be changed to --a--.
At claim 37, column 20, line 30, "the" should be changed to --a--.

Signed and Sealed this

Seventeenth Day of February, 1998

Attest:

BRUCE LEHMAN

*Attesting Officer*    *Commissioner of Patents and Trademarks*